United States Patent [19]

Yanagisawa et al.

[11] Patent Number: 5,274,594
[45] Date of Patent: Dec. 28, 1993

[54] STATIC RAM

[75] Inventors: Kazumasa Yanagisawa, Kokubunji; Atsushi Hiraishi, Ohme; Hideyuki Aoki, Fuchuu; Satoshi Oguchi; Sadayuki Ohkuma, both of Ohme, all of Japan

[73] Assignee: Hitachi, Ltd., Tokyo, Japan

[21] Appl. No.: 840,819

[22] Filed: Feb. 25, 1992

[30] Foreign Application Priority Data

Feb. 25, 1991 [JP] Japan .................................. 3-53344

[51] Int. Cl.⁵ .............................................. G11C 7/00
[52] U.S. Cl. ............................ 365/200; 365/225.7; 365/230.06
[58] Field of Search ............ 365/200, 230.06, 225.7, 365/190; 371/10.3

[56] References Cited

U.S. PATENT DOCUMENTS

| | | | |
|---|---|---|---|
| 4,587,639 | 5/1986 | Aoyama et al. | 365/200 |
| 4,603,404 | 7/1986 | Yamauchi et al. | 365/200 |
| 4,935,899 | 6/1990 | Morigami | 365/225.7 |
| 4,975,881 | 12/1990 | Kagami | 365/200 |
| 5,060,197 | 10/1991 | Park et al. | 365/200 |

Primary Examiner—Eugene R. LaRoche
Assistant Examiner—Son Dinh
Attorney, Agent, or Firm—Antonelli, Terry, Stout & Kraus

[57] ABSTRACT

A static RAM comprises: column select circuits for connecting a plurality of pairs of corresponding complementary data lines at a unit of each pair with common complementary data lines; and redundant circuits each composed of the complementary data line pair and the column select circuit corresponding to the unit. Load MOSFETs of the complementary data lines are arranged close to the column select circuits to inhibit the column selecting operations by a decoder circuit and turn off the load MOSFETs when fuse means is cut. An access to a defective address is detected by a redundant decoder stored with the defective address, when the fuse means is selectively cut, to select the column select circuits of the redundant circuit.

4 Claims, 5 Drawing Sheets

STATIC RAM

BACKGROUND OF THE INVENTION

The present invention relates to a static RAM (i.e., Random Access Memory) and, more particularly, to a technology which is effective when used, for example, as a defect relieving technology for a high capacity.

The following technologies are known in the art as the defect relief of the static RAM. In Japanese Patent Laid-Open No. 201298/1984, electric conduction means such as a fuse or switch capable of cutting an electric power supply is disposed midway of a supply current path, which is composed of a defective memory cell, an access transistor, a bit line, a pull-up transistor and a supply line, so that it may cut the path, if a defect occurs, to eliminate a useless DC leakage. In Japanese Patent Laid-Open No. 110100/1984, a power supply path to a normal memory column or row containing a defective bit is turned off by electric conduction means such as a fuse or switch to prevent a DC leakage current such as a gate leakage or field leakage of a defective memory cell from increasing. In Japanese Patent Laid-Open No. 178691/1984, on the other hand, fuse means is used to replace a defective memory cell, when a defect occurs, by a redundant memory cell and to cut a pull-up MOSFET corresponding to the defective memory cell.

SUMMARY OF THE INVENTION

In the aforementioned defect relieving technology, the fuse means is cut to separate normal circuits and preparatory circuits. As a result, the following problems have been found by our investigations. If a memory array of 1,024×1,204 is considered in a RAM having a memory capacity of about 1 Mbits, 1,024×2 fuse means are necessary for transmitting the output signal of a column decoder to the normal or preparatory circuits. Thus, one half, i.e., as many as 1,024 fuse means have to be cut no matter whether or not defective memory cells might exist. In order to prevent occurrence of the aforementioned DC leakage current, on the other hand, the complementary bit line pairs takes the number of 1,024×2 so that the corresponding number of fuse means becomes necessary. In case of a memory capacity as high as about 4 Mbits, only the column system needs the aforementioned double fuse means, as described above. In the practical RAM, the memory array is divided into plurality so that the bit line length and the word line length may not become excessively long, and the aforementioned fuse means required are in a number corresponding to that of division. Thus, the fuse means become so numerous and have to be cut one by one that they are not impractical for manufacture. Since, moreover, the fuse means are selectively cut by exposing to a laser beam or the like, they occupy a relatively large area and obstruct the integration.

An object of the present invention is to provide a defect relieving technology which is suited for a static RAM intended to have a high memory capacity with a simple structure.

Another object of the present invention is to provide a static RAM which can achieve a high speed in the writing operation with a simple structure.

The aforementioned and other objects and novel features of the present invention will become apparent from the description to be made with reference to the accompanying drawings.

A representative of the invention to be disclosed hereinafter will be briefly described in the following. Specifically, there is provided a static RAM which comprises: column select circuits for connecting a plurality of pairs of corresponding complementary data lines at a unit of each pair with common complementary data lines; and redundant circuits each composed of the complementary data line pair and the column select circuit corresponding to the unit. Load MOSFETs of the complementary data lines are arranged close to the column select circuits to inhibit the column selecting operations by a decoder circuit and turn off the load MOSFETs when fuse means is cut. An access to a defective address is detected by a redundant decoder stored with the defective address, when the fuse means is selectively cut, to select the column select circuits of the redundant circuit. Simultaneously with or separately of the aforementioned defect relief, moreover, a write control signal is fed to the decoder circuit to turn off the load MOSFETs of the complementary data line pairs which are to be written when in the writing operations.

According to the above-specified means, the normal circuits and the redundant circuits can be switched by less fuse means by the defect relief at the unit composed of the plurality of pairs of complementary data lines. Moreover, the space for packaging the fuse means can be efficiently retained without being restricted by the high data line pitch, and the load MOSFETs are arranged close to the column select circuits so that a circuit for preventing the DC current defects can be simply prepared for a high memory capacity. Since, still moreover, the load MOSFETs are disposed close to the column select circuits, the controls by the decoder can be simplified so that high speed writing operations can be accomplished by turning off the decoder circuit when in the writing operations.

DESCRIPTION OF THE PREFERRED EMBODIMENTS

Figure 1:
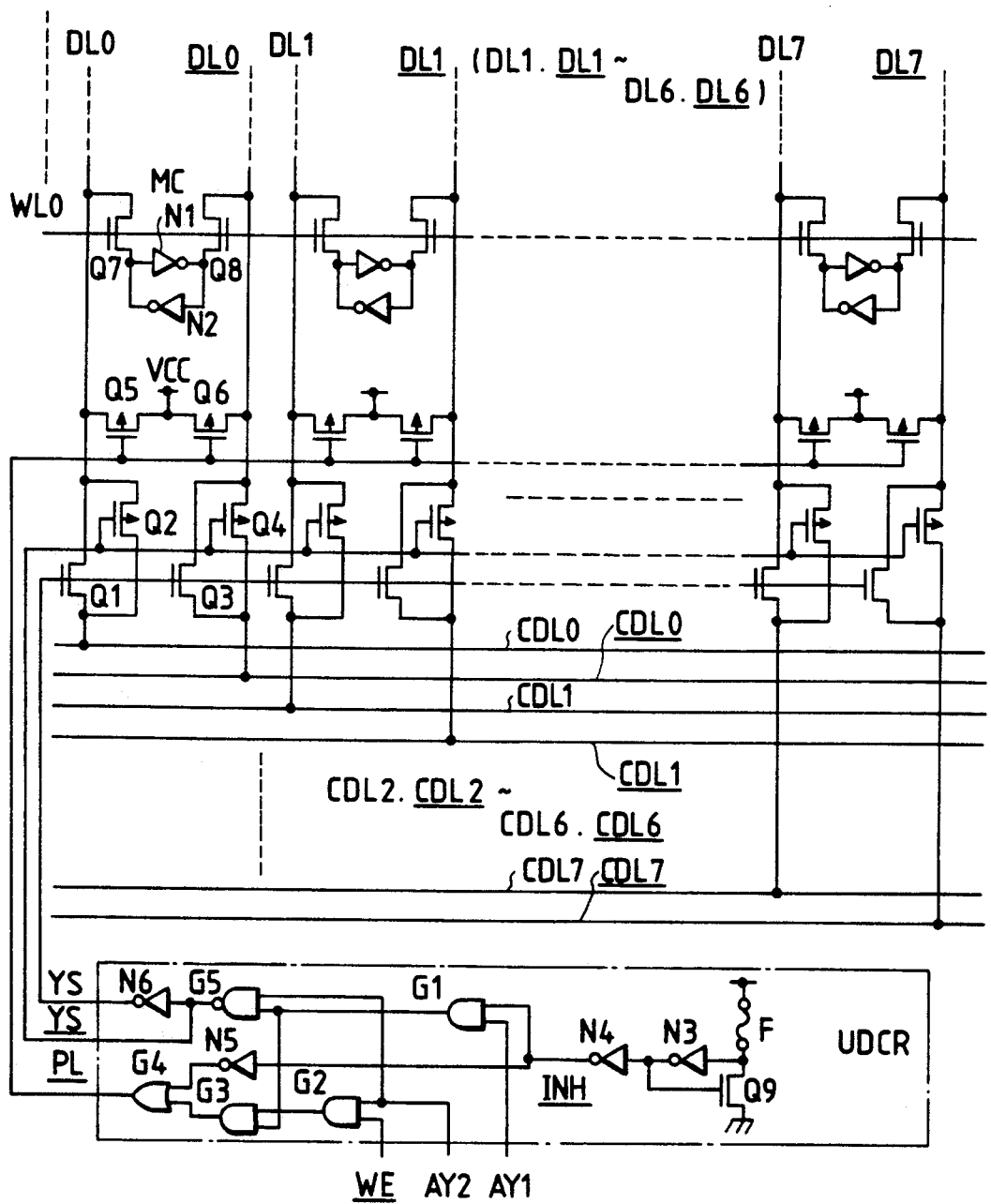
FIG. 1 is a circuit diagram showing an essential portion of one embodiment of a static RAM according to the present invention.

FIG. 1 is a circuit diagram showing an essential portion of one embodiment of a static RAM according to the present invention. In the same Figure, a defect relieving unit circuit (as will be shortly referred to as "unit") of the column system is shown by way of example. The individual circuit elements of the same Figure are formed together with later-described other circuits over one semiconductor substrate by the well known semiconductor integrated circuit manufacture technology.

The unit is composed of eight pairs of complementary data lines DL0 and $\overline{DL0}$ to DL7 and $\overline{DL7}$. In the same Figure, the complementary data lines DL0 and $\overline{DL0}$, DL1 and $\overline{DL1}$, and DL7 and $\overline{DL7}$ are representatively shown by way of example.

These complementary data lines DL0 and $\overline{DL0}$, DL1 and $\overline{DL1}$, and DL7 and $\overline{DL7}$ are connected through column select circuits with common complementary data lines CDL0 and $\overline{CDL0}$ to CDL7 and $\overline{CDL7}$. The column selector circuit corresponding to the data lines DL0 and $\overline{DL0}$ is constructed of a pair of CMOS switch circuits, in which an N-channel type MOSFET Q1 and a P-channel type MOSFET Q2, and an N-channel type MOSFET Q3 and a P-channel type MOSFET Q4 are individually connected in parallel.

Between the other complementary data lines DL1 and $\overline{DL1}$ and DL7 and $\overline{DL7}$, as exemplified, and the individually corresponding common complementary data lines CDL1 and $\overline{CDL1}$ and CDL7 and $\overline{CDL7}$, there is connected a CMOS switch composed of N-channel type MOSFETs and P-channel type MOSFETs, which are likewise connected in parallel.

Close to the column select circuit of the afore-mentioned complementary data lines DL0 and $\overline{DL0}$, there are disposed their load (or pull-up) MOSFETs Q5 and Q6. These load MOSFETs Q5 and Q6 used belong the P-channel type, although not especially limitative thereto. Specifically, the MOSFETs Q5 and Q6 have their sources connected with a supply voltage VCC and their drains connected with the complementary data lines DL0 and $\overline{DL0}$. The other complementary data lines DL1 and $\overline{DL1}$ and DL7 and $\overline{DL7}$, as shown by way of example, are equipped with similar load MOSFETs. These load MOSFETs have their gates shared and switched by the decoder circuit, as will be described in the following.

A unit column (Y system) decoder circuit UDCR is provided at a pitch corresponding to the aforementioned eight pairs of complementary data lines. In other words, the unit decoder circuit UDCR is arranged to correspond to the width of the eight pairs of the complementary data lines. The complementary data lines are arranged highly dense in a narrow gap by miniaturizing and devising the layout of the elements composing a memory cell MC for a higher memory capacity. If, therefore, the decoder circuit is to be disposed in one-to-one relation to the complementary data line pairs, the pitch of the complementary data lines is adjusted to the decoder circuit requiring a relatively large occupation area so that the high density is obstructed. Especially, the defect relief requires not only a logic circuit for forming a column select signal but also a fuse circuit and a gate circuit for inhibiting the selection of a defective complementary data line so that the scale of the decoder circuit becomes the larger and larger.

In this embodiment, as described above, the eight pairs of complementary data lines are unified for the column selecting operations so that the corresponding width of the decoder circuit is enlarged to that of the eight pairs of the complementary data lines. As a result, the decoder circuit UDCR to be formed can be given a relatively large circuit scale including: fuse means F for controlling varidation/invalidation of the operations; a MOSFET Q9 and inverter circuits N3 and N4 for producing a control signal $\overline{INH}$ by detecting whether or not the fuse means F is cut; and gate circuits G1 to G4 and inverter circuits N5 and N6 for producing select signals YS and $\overline{YS}$ for the aforementioned column select circuits and a control signal $\overline{PL}$ for the load MOSFETs.

The AND gate G1 has its input fed with a predecode signal AY1 produced by a predecode circuit outside of the Figure and the aforementioned control signal $\overline{INH}$. The AND gate G2 has its input fed with a write enable signal WE and a predecode signal AY2 produced by a predecode circuit outside of the Figure. The output of the gate circuit G2 and the output signal of the aforementioned gate circuit G1 are fed to the NAND gate circuit G3. The output signal of this gate circuit G3 and the output signal of the inverter circuit N5 made receptive of the control signal $\overline{INH}$ are inputted to the NOR gate circuit G4, which has its output signal used as the control signal $\overline{PL}$ to be fed to the gates of the aforementioned MOSFETs Q5 and Q6 and so on. The output signal of the aforementioned AND gate circuit G1 and the predecode signal AY2 are inputted to a NAND gate circuit G5, whose output signal is used as the select signal $\overline{YS}$ to be fed to the gates of the P-channel type MOSFETs Q2 and Q4 and so on constituting the column select circuit and is inverted through the inverter circuit N6 so that the inverted signal is used as the select signal YS to be fed to the gates of the N-channel type MOSFETs Q1 and Q3 and so on constituting the column select circuit.

The fuse means F transmits, unless it is cut, a high voltage such as the supply voltage VCC to the input of the inverter circuit N3. Then, the output signal of the inverter circuit N3 takes the low level to turn off the switch MOSFET Q9. As a result, no DC current is consumed between the fuse means F and the MOSFET Q9. The low level output signal of the inverter circuit N3 is outputted as a high level signal through the inverter circuit N4. Specifically, unless the fuse means F is cut, the operation of the aforementioned decoder circuit UDCR is validated to produce control signals for the aforementioned column select circuits and load MOSFETs in a manner to correspond to the predecode signals AY1 and AY2 and the write enable signal WE. If, on the contrary, the fuse means F is cut, the inverter circuit N3 has its input leaked to the low level to have an output signal at the high level. Then, the MOSFET Q9 is turned on so that the inverter circuit N3 has its input fixed at the low level when latched and fed with the supply power. As a result, the inverter circuit N4 has its output signal $\overline{INH}$ fixed at the low level. If the fuse means F is cut, the operation of the aforementioned decoder circuit UDCR is invalidated so that the control signal $\overline{PL}$, the select signal $\overline{YS}$ and the select signal YS are respectively fixed at the high level, the high level and the low level independently of the predecode signals AY1 and AY2 and the write enable signal WE. Thus, the switch MOSFETs and load MOSFETs constituting the column select circuit are turned off together. As a result, even if any of the complementary data lines DL0 and $\overline{DL0}$ to DL7 and $\overline{DL7}$ has a defective memory cell, the DC current can be prevented from flowing through the memory cells because all the complementary data lines are held in a floating state, as described above.

The complementary data lines DL0 and $\overline{DL0}$ to DL7 and $\overline{DL7}$ are connected with the input/output nodes of the memory cells. Specifically, the memory cell MC is constructed of: a latch circuit composed of CMOS inverter circuits N1 and N2 having their inputs and outputs connected crossly; and address selecting switch MOSFETs Q7 and Q8 having their input/output nodes connected with the complementary data lines. The aforementioned switch MOSFETs Q7 and Q8 have their gates connected with a word line WL0. In the aforementioned latch circuit, the CMOS inverter circuits N1 and N2 may be composed of memory N-channel type MOSFETs and high resistance elements connected between the drains of the MOSFETs and made of poly-silicon. These resistance elements are given a such a low current feeding capacity that the information voltage stored in the gate capacity of the memory MOSFETs may not be lost by the drain leakage current. As a result, the cell size can be drastically decreased while reducing the power consumption, as compared with the case in which a CMOS inverter circuit composed of N-channel type MOSFETs and P-channel type MOSFETs is used.

Figure 2:
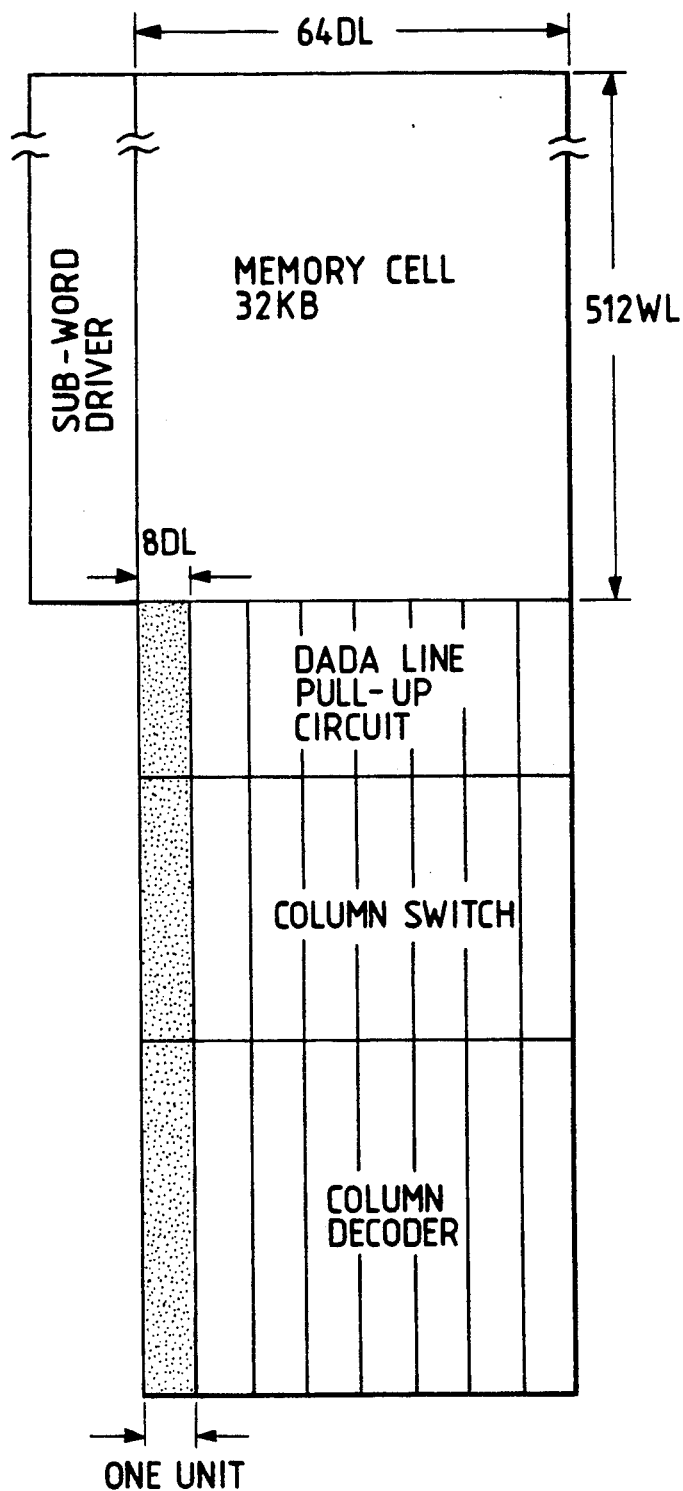
FIG. 2 is a layout diagram showing one embodiment of a memory mat in the static RAM according to the present invention.

FIG. 2 is a layout diagram showing one memory mat. The word lines are 512 as designated at WL0 to WL511, although not especially limitative thereto. Therefore, a memory array corresponding to one unit has a memory capacity of 8×512. As shown in the same Figure, one memory mat is constructed of eight units. The memory array has a memory capacity of 8×8×512 (i.e., about 32 Kbits). The aforementioned DL (i.e., Data Line) pull-up circuit is interposed between the column switch and the memory cell array, and a column decoder is disposed below the column switch.

The 512 word lines of the memory cell array are selected by a sub-word driver (or local driver), although not especially limitative thereto. Specifically, in response to the select signals from the main word lines and the select signals of the column system corresponding to the memory mat, the sub-word driver bring one of the 512 word lines into the selected state.

Figure 3:
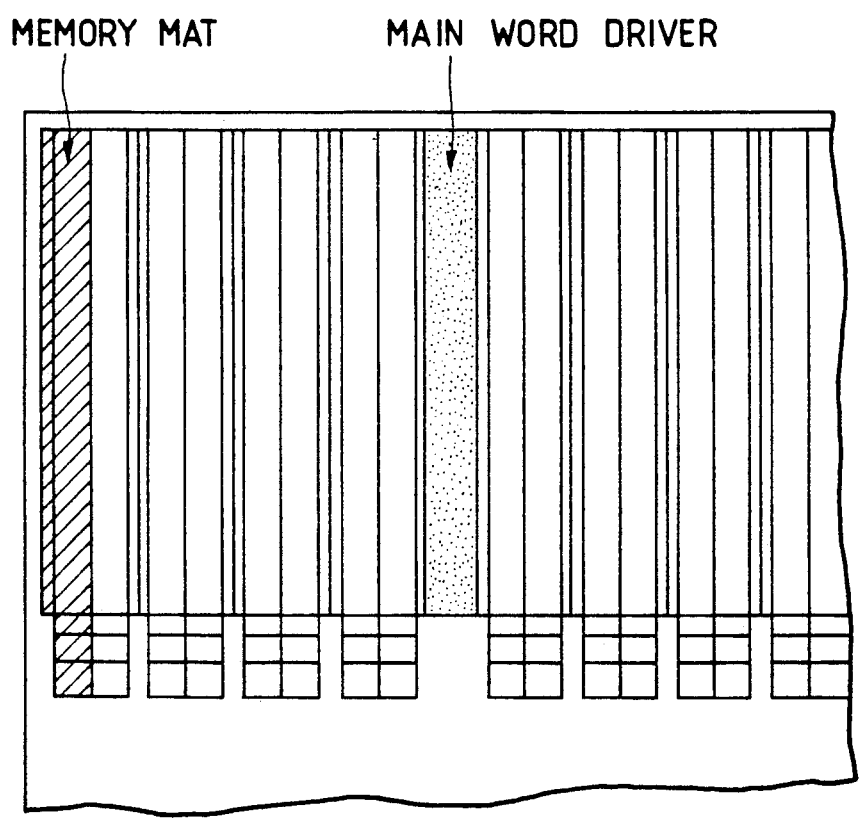
FIG. 3 is a layout diagram showing one embodiment of the memory mat around a main word driver in the static RAM according to the present invention.
Figure 4:
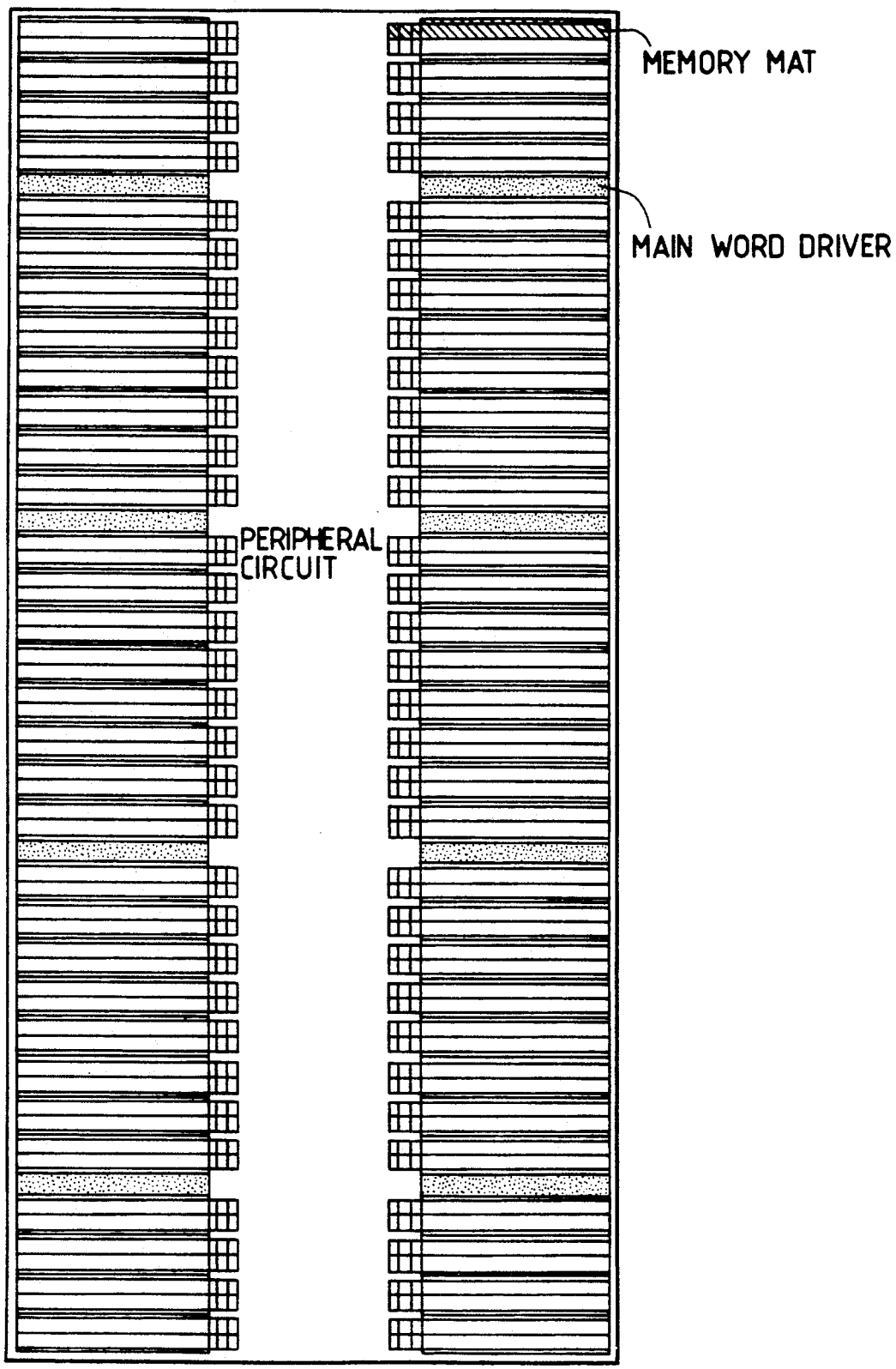
FIG. 4 is a chip layout diagram showing one embodiment of the static RAM according to the present invention.

FIG. 3 is a layout diagram showing the relation between the main word driver and the memory mats. Eight memory mats are individually arranged at the righthand and lefthand across the main word driver. As a result, the one main word driver bears selection of word lines corresponding to 32K×16 (i.e., about 512 Kbits). FIG. 4 is a layout diagram showing the chip in its entirety. Since the aforementioned main word drivers are disposed in a total number of eight, the chip has a memory capacity of about 4 Mbits in its entirety.

The chip is formed into a rectangular shape, whose longitudinal center portion is equipped with peripheral circuits or terminals. Specifically, the connection of the chip and the bonding pads is accomplished by the LOC technique. For example, a pair of leads extending along the aforementioned center portion are disposed to provide a plurality of power supply pads and earth potential pads, although not shown because they have no direct relation to the present invention. Since the chip is thus fed with the supply voltage VCC and the earth potential from a plurality of positions through the lead frame made of a wiring material of low resistance, the power supply impedance of the circuit to be fed with those potentials can be suppressed to a low level. As a result, the noises to be established in the power supply lines or the earth lines due to the circuit operating current can be suppressed to the low level while raising the operation margin of the internal circuits and the level margin of the input signals coming from the outside.

Moreover, the address inputting bonding pads and the control inputting bonding pads are arranged at the center portion of the chip, as described above, and the peripheral circuits such as the address buffers, the predecoder circuits and the control circuits are accordingly arranged close to the former. According to this structure, the signal lines can extends radially from the center portion of the chip so that the substantial signal propagation distance can be shortened to about one half of the chip size. The signal lines have their wiring resistance increased in proportion to the wiring length and their wiring capacity also increased in proportion to the wiring length. Hence, the signal propagation delay time is elongated on principle in proportion to the square of the signal propagation distance. Thus, the signal propagation delay time can be reduced to one quarter by shortening the signal propagation distance substantially to one half, as above.

The unit redundant circuit is constructed of a circuit corresponding to the aforementioned one unit of FIG. 2, namely, the eight pairs of complementary data lines, the pull-up circuits, the column switches and the column decoder. This structure corresponds to that of FIG. 1. However, the column decoder has a function to detect the memory of and access to the defective addresses. Moreover, enabling fuse means is provided to activate the functions to detect the aforementioned access to a defective address, if the fuse means is cut, contrary to the aforementioned normal unit, to output the select signal of the column switches, and to turn on the pull-up load MOSFETs.

Such redundant circuit may have the structure of the unit of the aforementioned memory mat of FIG. 2. In this structure, in case a corresponding memory mat is defective, the eight pairs of complementary data lines having the defective memory cell in the memory mat are substantially cut in response to the OFF states of the column switch MOSFETs and the load MOSFETs, and the redundant circuit is accessed to in place.

The aforementioned structure, in which the redundant circuit is provided in one-to-one relation to the memory mat, has its redundant circuits deteriorated in the using efficiency. Thus, a plurality of redundant circuits are provided for a plurality of memory mats around the main word driver, as shown in FIG. 3. Five units of redundant circuits are disposed at the righthand and lefthand sides across the main word driver, although not especially limitative thereto. These individual five units of redundant circuits can be commonly used for the individually corresponding eight memory mats. In case two units are defective in one memory mat, for example, they are relieved by using two of the aforementioned five units of redundant circuits. By taking this structure, the maximum five units of defective cells in one memory mat can be relieved. This relief is premised by the assumption that the remaining memory mats are not defective.

In case, moreover, the main word driver produces the word line select signals commonly for the individually eight memory mats at the righthand and lefthand sides and in case the individually eight memory mats are connected with the common complementary data lines, the aforementioned ten redundant circuits can be commonly used for the sixteen memory mats. Incidentally, the memory cell arrays of the redundant circuits have their word lines selected directly by the main word driver. In addition, redundant sub-word drivers may be provided to select the word lines of the individually five redundant circuits by making use of the addresses corresponding to the righthand and lefthand memory mats across the main word driver.

The number of the aforementioned redundant circuits may be eight units corresponding to one memory mat at each of the righthand and lefthand sides of the main word driver so that the structure may be identical to that in which one redundant circuit is disposed in each memory mat. As in the foregoing embodiment, the number and arrangement of the redundant circuits may take a variety of modes of embodiment.

Figure 5:
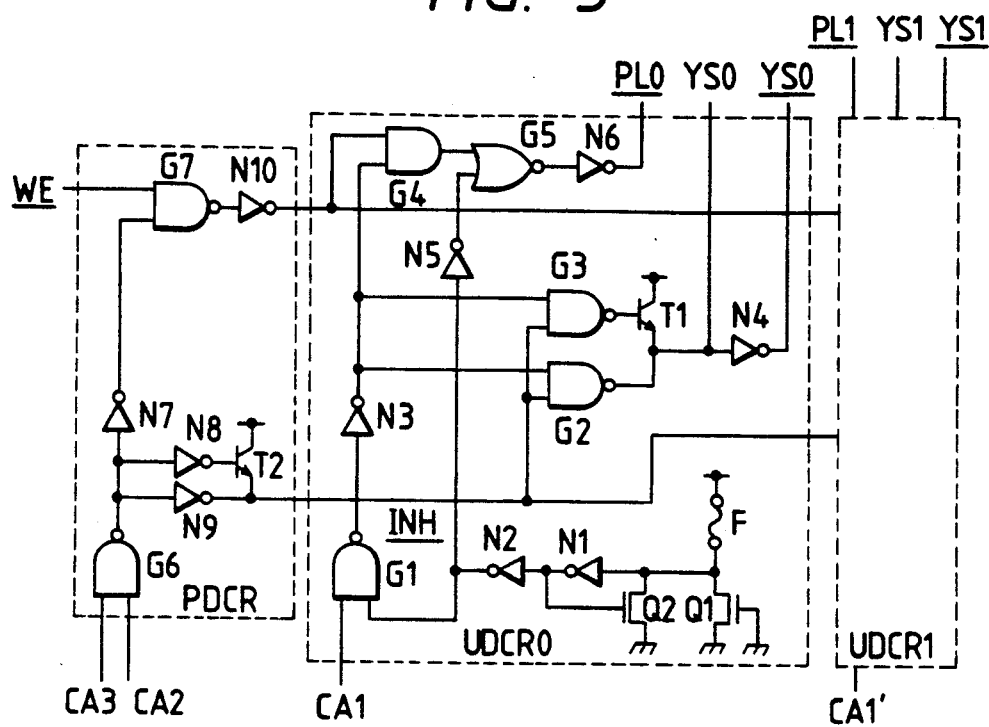
FIG. 5 is a circuit diagram showing another embodiment of a predecoder circuit and a decoder circuit corresponding to the memory mat of the static RAM according to the present invention.

FIG. 5 is a circuit diagram showing another embodiment of the predecoder circuit corresponding to one memory mat and the unit decoder circuit corresponding to one unit. The circuit symbols attached to the logic gates and circuit elements of the same Figure are partially overlapped by the aforementioned ones of FIG. 1 but should be understood to be basically different from them.

A predecoder circuit PDCR is shared among eight memory mats, although not especially limitative thereto. In case of a memory capacity of about 4 Mbits, as described hereinbefore, the column address signals are composed of 11 bits, as indicated at A0 to A10. For example, the memory chip of FIG. 4 is quartered longitudinally and transversely by using the most significant two bits of the row and column lines. In FIG. 4, the complementary data lines are halved by the transverse divisions. The thirty two memory mats thus transversely divided are divided into four groups of eight memory mats which are arranged at the righthand and lefthand sides across the main word driver in response to the next significant address signals A9 and A8, and A7 and A6.

In the predecoder circuit outside of the same Figure, the aforementioned address signals A9 to A6 of 4 bits are divided into two bits so that individually four predecode output signals are produced by the two decode circuits. Of these, the quarter decode outputs CA3 and CA2 are fed to an NAND gate G6. As a result the select signals produced correspond to the eight memory mats. In this embodiment, a drive circuit composed CMOS inverter circuits N8 and N9 and a bipolar transistor T2 is used to drive a relatively high load resulting from that a number of gates corresponding to the eight units of each memory mat. Specifically, an inverter circuit N8 produces a drive signal to be fed to the base of the emitter-follower transistor T2. An inverter circuit N9 has its output terminal connected with the emitter of the aforementioned transistor T2. This transistor T2 raises its output signal promptly to the high level in response to the change from the low to high levels of the inverter circuit N8. However, the output voltage to be outputted from the emitter of the transistor T2 is limited to the level of VCC−VBE (i.e., the base-emitter voltage of the transistor T2). After this, the output voltage is raised to the supply voltage VCC by the inverter circuit N9 which is connected with the emitter of the transistor T2. Thus, the output voltage can be promptly raised from the low level such as the earth potential to the high level such as the supply voltage VCC.

The output signal of the aforementioned NAND gate circuit G6 is fed through a CMOS inverter circuit N7 to one input of the NAND gate circuit G7. This NAND gate circuit G7 has its other gate fed with the write enable signal WE. The output signal of the NAND gate circuit G7 is fed through an inverter circuit N10 commonly to decoder circuits which correspond to the eight units, as will be described in the following.

The unit decoder circuit is fed with a ⅛ predecode output CA1 which is produced from the address signals of 3 bits of the remaining address signals A5 to A3. The predecode output CA1 is fed to the NAND gate G1. This NAND gate G1 has its other input fed with the control signal $\overline{INH}$ which is produced by the control circuit composed of the fuse means, the MOSFETs Q1 and Q2 and the inverter circuits N1 and N2 like before. In this embodiment, the pull-down MOSFET Q1 provided has a high resistance against the fuse means F.

The output signal of the NAND gate circuit G1 is fed through the CMOS inverter circuit N3 to one input of each of the NAND gates G2 and G3. These NAND gate circuits G3 and G2 correspond to the inverter circuits N8 and N9 and have their output signals fed to the base and emitter of an output transistor T1. From the emitter of this transistor T1, there is produced the select signal YS for controlling an N-channel type column switch transistor. Through the inverter circuit N4, there is provided the select signal $\overline{YS}$ for controlling a P-channel type column switch transistor.

In this embodiment, the high level of the output signal is produced in the CMOS circuit when the P-channel type MOSFET is turned on. This P-channel type MOSFET has a low current drivability per unit size. Therefore, the rise of the select signal YS having a high active level is speeded up by using the aforementioned bipolar transistor. On the contrary, the select signal $\overline{YS}$ having a low active level is directly produced by the aforementioned CMOS inverter circuit N4 because it is produced by the N-channel type MOSFET having a high current drivability per unit size.

The output signal of the aforementioned inverter circuit N3 and the output signal of an inverter circuit N10 of the predecode circuit are fed to the AND gate circuit G4. The output signal of this AND gate circuit G4 and the output signal of the inverter circuit N5 made receptive of the control signal INH are fed to the inputs of the NOR gate circuit G5. The output signal of this NOR gate circuit G5 is fed through the inverter circuit N6 to the load (pull-up) MOSFET and is outputted as the control signal $\overline{PL}$. In this case, too, the signal $\overline{PL}$ having a low active level is outputted so that the output signal is produced like before by the CMOS inverter circuit N6.

The decode output produced by the aforementioned predecoder PDCR is fed commonly to the remaining seven decoder circuits including the other decoder circuit UDCR which is made receptive of the aforementioned ⅛ predecode signal CA1′. The eight decoder circuits in one memory mat share the output of the aforementioned predecoder circuit PDCR and are fed with any of the eight decode outputs produced from the address signals A5 to A3 of 3 bits, so that the control signal $\overline{PL}$ for turning off the load MOSFETs of the unit to be written can be produced by the column select signals YS and $\overline{YS}$ and write enable signal $\overline{WE}$ corresponding to one unit.

If, moreover, the aforementioned fuse F is cut, the column select signal YS is fixed at the low level whereas the column select signal $\overline{YS}$ is fixed at the high level in response to the low level of the fuse control signal $\overline{INH}$ so that the column switch MOSFET is held in the OFF state, and the signal $\overline{PL}$ is fixed at the high level so that the load MOSFETs are held in the OFF state. As a result, even if a defective cell has a current path for the DC current to flow between itself and the complementary data lines, the DC current can be blocked by substantially cutting off the complementary data lines.

The remaining address signals A0 to A2 of 3 bits are used for selecting one of the complementary data lines of the aforementioned unit. For example, these address signals are shrunk in case of a memory access at a unit of 8 bits. In case of a memory access at a unit of 4 bits, the address signals A0 and A1 of less significant 2 bits are shrunk. These bit structures can be switched by the bonding option or the like.

Figure 6:
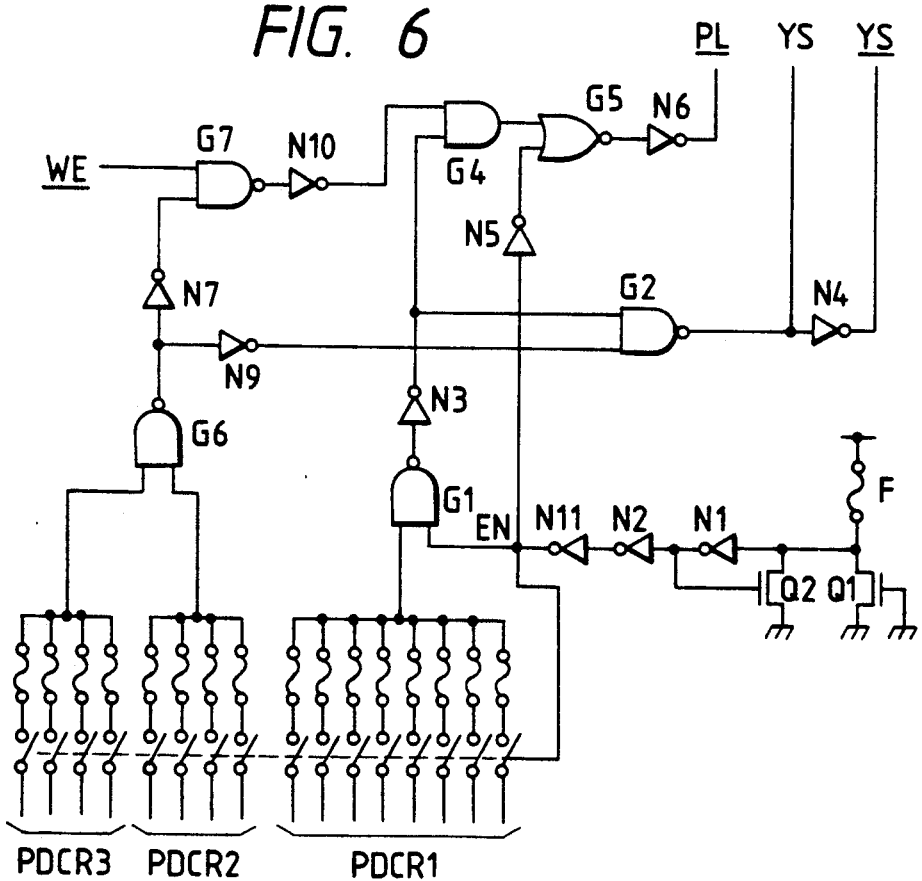
FIG. 6 is a circuit diagram showing one embodiment of the decoder circuit corresponding to a redundant circuit in the static RAM according to the present invention.

FIG. 6 is a circuit diagram showing one embodiment of the decoder circuit to be disposed in the redundant circuit. This embodiment corresponds to the aforementioned decoder circuit of the normal circuit shown in FIG. 5. Hence, the gate circuits having the identical logic functions are designated at the common circuit symbols. The redundant circuit is activated contrary to the normal circuit if the fuse means F is cut. Thus, an inverter circuit N11 is added to the output of the aforementioned fuse circuit so that a control signal EN at a high active level is produced if the fuse means F is cut.

The NAND gate circuit to be fed with the predecode output signal corresponding to the address of a defective unit is equipped with eight fuse means for selecting any of the ⅛ predecodes. When the seven of the eight fuses excepting the fuse corresponding to the address of the defective unit is cut, the address is stored.

In order that the redundant circuit may be used for relieving the defective unit of any of sixteen memory mats, the NAND gate circuit G6 has its input equipped with individually four fuse means for selecting the individually quarter predecode outputs in response to the aforementioned predecode outputs CA3 and CA2. As a result, the address of the memory mat having the defective unit is stored.

In order that the fuse means for storing the aforementioned defective address may not conflict in the aforementioned predecode output while they are not cut, their inputs are equipped with switches. These switches are constructed, like the aforementioned column switch, of a CMOS switch circuit in which N-channel type MOSFETs and P-channel type MOSFETs are connected in parallel, although not especially limitative thereto. This CMOS switch is switched by the aforementioned control signal EN. While the aforementioned fuse means F is not cut, the control signal EN takes the low level to turn off the aforementioned switch. Thus, the individual predecode outputs are prevented from conflicting through the defective address storing fuse means. In case this redundant circuit is used for the defect relief, moreover, the aforementioned fuse means F is cut to raise the control signal EN to the high level. As a result, the aforementioned switch is turned on. At this time, the remaining fuse means excepting one are cut in response to the individual predecode outputs so that the address itself is stored and that the access to the defective address is detected.

Incidentally, the aforementioned switches may be disposed at the output sides (or at the common node sides) of the fuse means.

In case the redundant circuits are used for relieving any defective unit of the four memory mats, the NAND gate circuit G6 has its one input fed fixedly with the predecode output which is produced by the address signals A9 and A7. According to this structure, the number of fuse means to be attached to one redundant circuit can be reduced to four. Thus, the using efficiency of the redundant circuits and the number of the necessary fuse means are contrary to each other. Hence, how far of the memory mats the redundant circuits can have their defects relieved by the redundant circuits is optimized from the defect percentage and the occupation area to be assigned to the fuse means.

Even the redundant circuit to be used in placed of the defective unit is fed with the write enable signal $\overline{WE}$, and the load MOSFETs are turned off when the redundant circuit is to be written. Thus, if the write signal produced by the write amplifier is transmitted through the common complementary data lines and the column switches to the complementary data lines, the signal amplitude of the complementary data lines can be enlarged to effect the high speed writing operations without reducing the output impedance of the write amplifier so much.

Moreover, the write recovery of the complementary data lines after the writing operation is accomplished at a high speed in response to the ON state of the load MOSFETs after the end of the writing operation by setting the conductances of the load MOSFETs at a relatively high level. This effect is similar in each unit of the normal circuit.

The aforementioned writing system can be used independently of the aforementioned defect relieving technology. This is because the load MOSFETs can be easily controlled with the output signals of the decoders for forming the select signals to be fed to the column switches, by taking the structure in which the load MOSFETs are arranged close to the column switches. Specifically, by feeding the write enable signal $\overline{WE}$ or the like for instructing the writing operation to the decoder circuits as in the foregoing embodiment and by combining it with the aforementioned column select signals, the load MOSFETs corresponding to the complementary data lines, in which the actual writing operations are carried out, can be turned off. As a result, each of the complementary data lines is equipped with one load MOSFET so that its conductance can be set to a relatively high level, while considering only the reading operation, to restrict the signal amplitude at the reading time thereby to speed up the operation. At the same time, the writing operation is also speeded up by turning off the load MOSFETs at the writing time. Since, moreover, the conductance of the load MOSFETs is set at a relatively high level, the reading operation after the writing operation can also be speeded up without providing any special write recovery circuit.

The following operational effects can be achieved from the embodiments thus far described.

(1) The static RAM according to the present invention comprises: column select circuits for connecting a plurality of pairs of corresponding complementary data lines at a unit of each pair with common complementary data lines; and redundant circuits each composed of the complementary data line pair and the column select circuit corresponding to the unit. Load MOSFETs of the complementary data lines are arranged close to the column select circuits to inhibit the column selecting operations by a decoder circuit and turn off the load MOSFETs when fuse means is cut. An access to a defective address is detected by a redundant decoder stored with the defective address, when the fuse means is selectively cut, to select the column select circuits of the redundant circuit. According to this structure, the following effects can be attained. In the defective unit, the complementary data lines are substantially cut off so that the DC leakage current therethrough can be prevented. By switching to the redundant circuit at the aforementioned unit, the switch circuit including the aforementioned fuse means can be efficiently provided without sacrificing the array of the complementary data lines in the memory array.

(2) By using the redundant circuit commonly for a plurality of memory mats, there can be attained an effect that the using efficiency of the redundant circuit, that is, the defect relieving percentage by the unit redundant circuit can be enhanced.

(3) By using the signal lines or logic circuits for turning off the load MOSFETs when a defect occurs and by turning off the load MOSFETs to be actually subjected to the writing operation, there can be attained an effect that the writing operation can be speeded up.

(4) By arranging the load MOSFETs close to the column select circuits and by setting their conductances to a relatively high level in accordance with the reading operation so that the column selecting decoder circuits may be fed with the write control signal to turn off the aforementioned load MOSFETs when in the writing operation, there can be attained an effect that the memory accesses to the writing/reading operations can be speeded up by the simple structure.

Although our invention has been specifically described on the basis of the embodiments thereof, it should not be limited to the embodiments but can naturally be modified in various manners without departing from the gist thereof. For example, the defective address may be detected by a structure which is constructed of a latch circuit for latching the information independence upon the existence of the cut fuse means and a comparator using an exclusive logic sum circuit or a logic sum circuit for comparing the latched information and an address signal. The fuse means can be exemplified by a variety of modes of embodiment, in which they are made of a poly-silicon layer or a thin aluminum wiring line and cut by an energy beam such as a laser beam, in which the polysilicon layer is fused by a relatively high current, or in which the poly-silicon layer is subjected to a laser annealing to have its resistance changed so that its electric characteristics may be changed equivalently to the cutting operation.

The layout of the static RAM over the semiconductor chip can take not only those of the foregoing embodiments but also a variety of modes of embodiment, in which the memory mat groups are arranged at the center portion of the chip whereas the peripheral circuits are arranged in the periphery of the chip.

The peripheral circuit of the static RAM may be constructed of a Bi-CMOS circuit in which a CMOS circuit and bipolar transistors are combine. The input/output interface may be exemplified by not only the CMOS interface but also a TTL interface or an ECL interface. Incidentally, the operating voltage used is exemplified by a negative voltage of −VEE in case the ECL interface is used.

In order to reduce the power consumption and to speed up the operation, the internal circuits may have their operating voltages set to as low as about 3 V. For compatibility with the static RAM of 5 V, the supply voltage of 5 V may be fed from the outside and dropped to the aforementioned voltage of about 3 V by an internal voltage drop circuit. In this case, the input buffer and the output buffer are additionally given a level changing function for changing signals of 5 V.

The present invention can be widely used as the static RAM.

The effect to be obtained by the representative of the invention disclosed herein will be briefly described in the following. Specifically, the static RAM of the invention comprises: column select circuits for connecting a plurality of pairs of corresponding complementary data lines at a unit of each pair with common complementary data lines; and redundant circuits each composed of the complementary data line pair and the column select circuit corresponding to the unit. Load MOSFETs of the complementary data lines are arranged close to the column select circuits to inhibit the column selecting operations by a decoder circuit and turn off the load MOSFETs when fuse means is cut. An access to a defective address is detected by a redundant decoder stored with the defective address, when the fuse means is selectively cut, to select the column select circuits of the redundant circuit. According to this structure, in the defective unit, the complementary data lines are substantially cut off so that the DC leakage current therethrough can be prevented. By switching to the redundant circuit at the aforementioned unit, the switch circuit including the aforementioned fuse means can be efficiently provided without sacrificing the array of the complementary data lines in the memory array. The writing operation can be speeded up by turning the aforementioned load MOSFETs.

What is claimed is:

1. A static RAM comprising: column select circuits for connecting a plurality of pairs of corresponding complementary data lines at a unit of each pair with common complementary data lines; redundant circuits each composed of the complementary data line pair and the column select circuit corresponding to the unit; MOSFETs arranged close to said column select circuits and constituting loads of said complementary data lines; a decoder circuit equipped with fuse means for inhibiting the column selecting operations when said fuse means is cut; a load control circuit for turning off said MOSFETs constituting the loads when said fuse means is cut; and a redundant decoder circuit for storing a defective address, when said fuse means is selectively cut, and for selecting said column select circuits in response to an access to the stored defective address.

2. A static RAM according to claim 1, wherein the storage of said defective address constitutes a signal path for transmitting an internal address signal or predecode signal equivalently corresponding to said defective address by said fuse means.

3. A static RAM according to claim 2, wherein said decoder circuit is additionally given a function to turning off the MOSFETs constituting the loads corresponding to the unit which is instructed to select when in a writing operation in response to a write control signal.

4. A static RAM according to claim 3, wherein one memory mat is formed of the plurality of units and has its word lines selected by a sub-word driver made receptive of a select signal corresponding to a main word line and the memory mat, wherein said main word line is shared among a plurality of memory mats by a main word driver, and wherein the redundant circuit corresponding to the plurality of units is provided around said main word driver.

* * * * *